(12) United States Patent
Miller

(10) Patent No.: US 8,154,380 B2
(45) Date of Patent: Apr. 10, 2012

(54) SENSOR MOUNT ASSEMBLIES AND SENSOR ASSEMBLIES

(75) Inventor: David H. Miller, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 811 days.

(21) Appl. No.: 12/263,196

(22) Filed: Oct. 31, 2008

(65) Prior Publication Data

US 2010/0108836 A1    May 6, 2010

(51) Int. Cl.
*H01C 13/00* (2006.01)
(52) U.S. Cl. .................. 338/334; 324/718; 439/715
(58) Field of Classification Search .......... 338/333–334, 338/13, 226, 275, 315; 324/224, 426, 713, 324/117 R, 117 H; 439/715, 835, 622, 249, 439/787
See application file for complete search history.

(56) References Cited

U.S. PATENT DOCUMENTS

| 3,245,021 | A | * | 4/1966 | Kernander et al. | 338/49 |
| 3,271,509 | A | * | 9/1966 | Calderwood et al. | 174/121 R |
| 5,017,859 | A | * | 5/1991 | Engel et al. | 324/127 |
| 6,280,259 | B1 | * | 8/2001 | Stollburges | 439/715 |
| 6,515,468 | B1 | * | 2/2003 | Morimoto et al. | 324/117 H |
| 6,558,198 | B2 | * | 5/2003 | Kobayashi et al. | 439/620.29 |
| 6,560,123 | B1 | * | 5/2003 | de Varennes et al. | 361/807 |

* cited by examiner

*Primary Examiner* — Kyung Lee
(74) *Attorney, Agent, or Firm* — Ingrassia Fisher & Lorenz, P.C.

(57) ABSTRACT

Sensor mount assemblies and sensor assemblies are provided. In an embodiment, by way of example only, a sensor mount assembly includes a busbar, a main body, a backing surface, and a first finger. The busbar has a first end and a second end. The main body is overmolded onto the busbar. The backing surface extends radially outwardly relative to the main body. The first finger extends axially from the backing surface, and the first finger has a first end, a second end, and a tooth. The first end of the first finger is disposed on the backing surface, and the tooth is formed on the second end of the first finger.

20 Claims, 2 Drawing Sheets

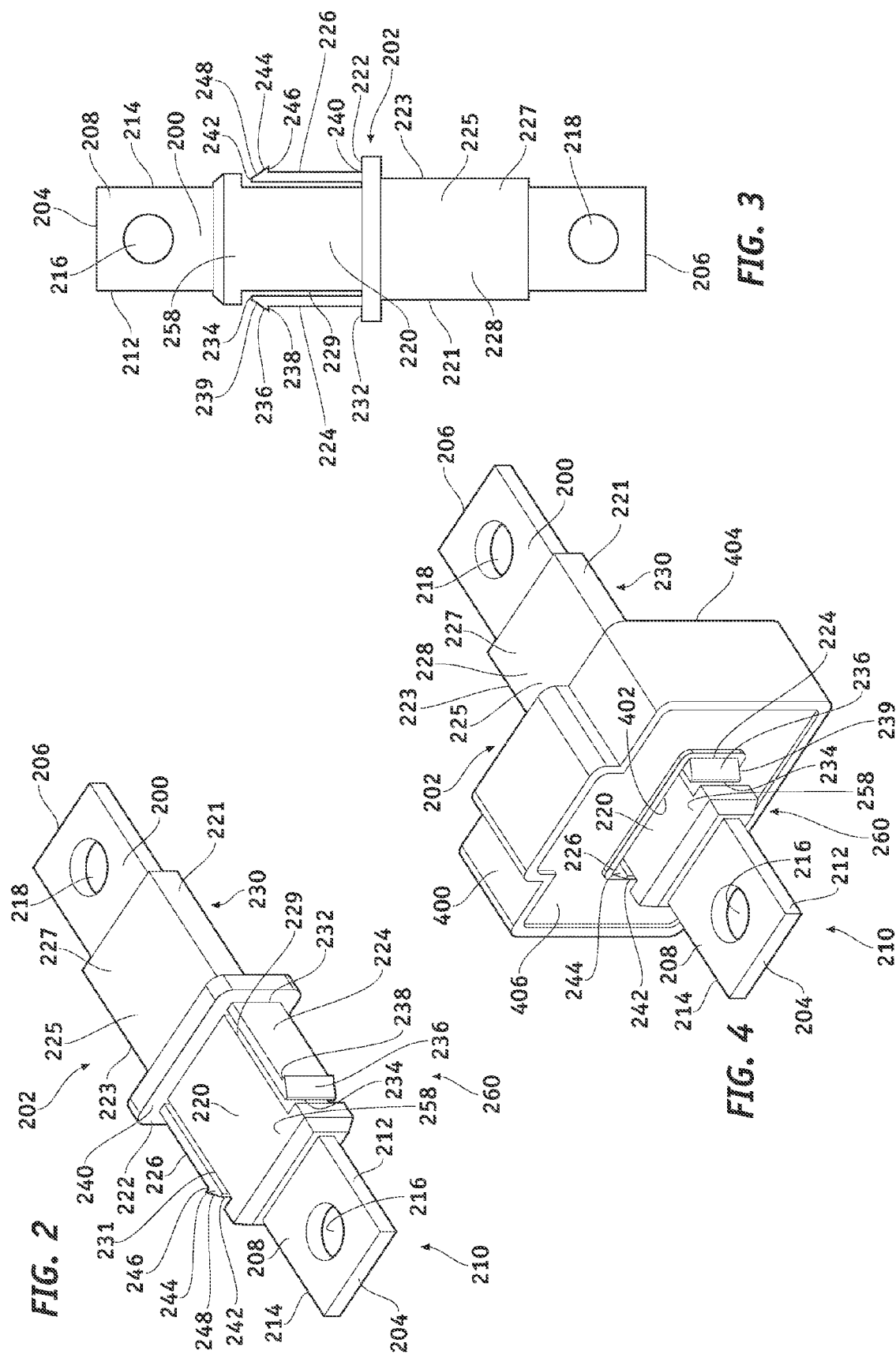

SENSOR MOUNT ASSEMBLIES AND SENSOR ASSEMBLIES

STATEMENT REGARDING FEDERALLY SPONSORED RESEARCH OR DEVELOPMENT

This invention was made with Government support under DE-FC26-07NT43123 awarded by the United States Department of Energy. The Government has certain rights in this invention.

TECHNICAL FIELD

The present invention generally relates to vehicles, and more particularly relates to sensor mount assemblies and sensor assemblies for use in vehicles.

BACKGROUND OF THE INVENTION

Vehicles can utilize electric traction motors to drive wheels. In such case, a vehicle may include a multi-phase alternating current (AC) motor coupled to a power inverter. The power inverter converts direct current (DC) from a power source to alternating current that can be used by the AC motor. Typically, the power inverter includes components, such as insulated gate bipolar transistors (IGBTs) and a direct bonded copper (DBC) substrate. The IGBTs act as switches used in converting the power from DC to AC and are mounted on the DBC substrate. The DBC substrate includes integrated bus bars that may be combined with a circuit card and a signal connector to provide a power electronics package for the vehicle.

As the vehicle starts, changes cruising speeds, accelerates and/or brakes, power demands of the electric traction motor driving the vehicle may fluctuate over a relatively wide range (e.g., in a range of from about 5 kW to about 120 kW). These power demand fluctuations may be relatively wide, which may cause temperature changes in the power inverters during operation. Over time, the operability of the power inverter may degrade due to the temperature changes. Specifically, because IGBTs and DBCs may be made of different materials, they may expand and/or contract at different rates and thus, may shift positions relative to each another.

To limit the expansions and contractions of the power inverter components to within a selected range, the temperature changes within the power inverter may be controlled. For example, the power inverter may include temperature sensors for sensing temperature data from the power inverter components. The temperature data may be supplied to the controller, which may then limit a supply of current to the power inverter. To ensure that the current supply does not exceed a particular magnitude, a current sensor may be included to sense and communicate current data to the controller as well.

Though the aforementioned configurations are generally suitable for purposes of controlling temperatures of the power inverter components, they may be improved. For example, because wires, retaining clamps, fasteners, and the like are typically used to mount the sensors to a chassis of the power inverter, disassembly and/or assembly of the parts during a repair process may be relatively time consuming. Additionally, because numerous individual parts may be employed to mount the sensors, repair costs may be relatively high.

Accordingly, it is desirable to have an assembly for mounting a sensor in a power inverter that is easier and less expensive to include than conventional sensor assembly mounts. Moreover, it is desirable for the assembly to be capable of being retrofitted into existing power inverters and/or into other types of components within which a simplified mounting assembly may be beneficial. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Sensor mount assemblies and sensor assemblies are provided.

In an embodiment, by way of example only, a sensor mount assembly includes a busbar, a main body, a backing surface, and a first finger. The busbar has a first end and a second end. The main body is overmolded onto the busbar. The backing surface extends radially outwardly relative to the main body. The first finger extends axially from the backing surface, and the first finger has a first end, a second end, and a tooth. The first end of the first finger is disposed on the backing surface, and the tooth is formed on the second end of the first finger.

In another embodiment, by way of example only, a sensor assembly includes a housing, a sensor, a busbar, a main body, a backing surface, and a first finger. The housing has a first engagement surface, a second engagement surface, and an opening. The sensor is disposed in the housing. The busbar extends through the opening of the housing and having a first end and a second end. The main body is overmolded onto the busbar and disposed in the opening of the housing. The backing surface extends radially outwardly relative to the main body and abuts the first engagement surface of the housing. The first finger extends axially from the backing surface and has a first end, a second end, and a tooth. The first end of the first finger is disposed on the backing surface, and the tooth is formed on the second end of the first finger and has a retention surface abutting the second engagement surface of the housing.

In another embodiment, by way of example, a sensor assembly includes a housing, a sensor, a busbar, and a mount assembly. The housing has a first engagement surface, a second engagement surface, and an opening. The sensor is disposed in the housing. The busbar extends through the opening of the housing and has a first end and a second end. The mount assembly includes a main body, a backing surface, a first finger, and a second finger. The main body is overmolded onto the busbar and is disposed in the opening of the housing. The backing surface extends radially outwardly relative to the main body and abuts the first engagement surface of the housing. The first finger extends axially from the backing surface and has a first end, a second end, and a tooth. The first end of the first finger is disposed on the backing surface, and the tooth of the first finger is formed on the second end of the first finger and has a retention surface abutting the second engagement surface of the housing. The second finger extends axially from the backing surface and has a first end, a second end, and a tooth. The first end of the second finger is disposed on the backing surface, and the tooth of the second finger is formed on the second end of the second finger and has a retention surface abutting the second engagement surface of the housing.

DESCRIPTION OF THE DRAWINGS

Embodiments of the present invention will hereinafter be described in conjunction with the following drawing figures, wherein like numerals denote like elements.

FIG. 2 is a perspective view of a busbar including a snap feature, according to an embodiment;

FIG. 3 is a perspective view of the busbar of FIG. 2, according to another embodiment; and FIG. 4 is a perspective view of the busbar of FIG. 2 inserted through a portion of a housing, according to an embodiment.

Figure 1:
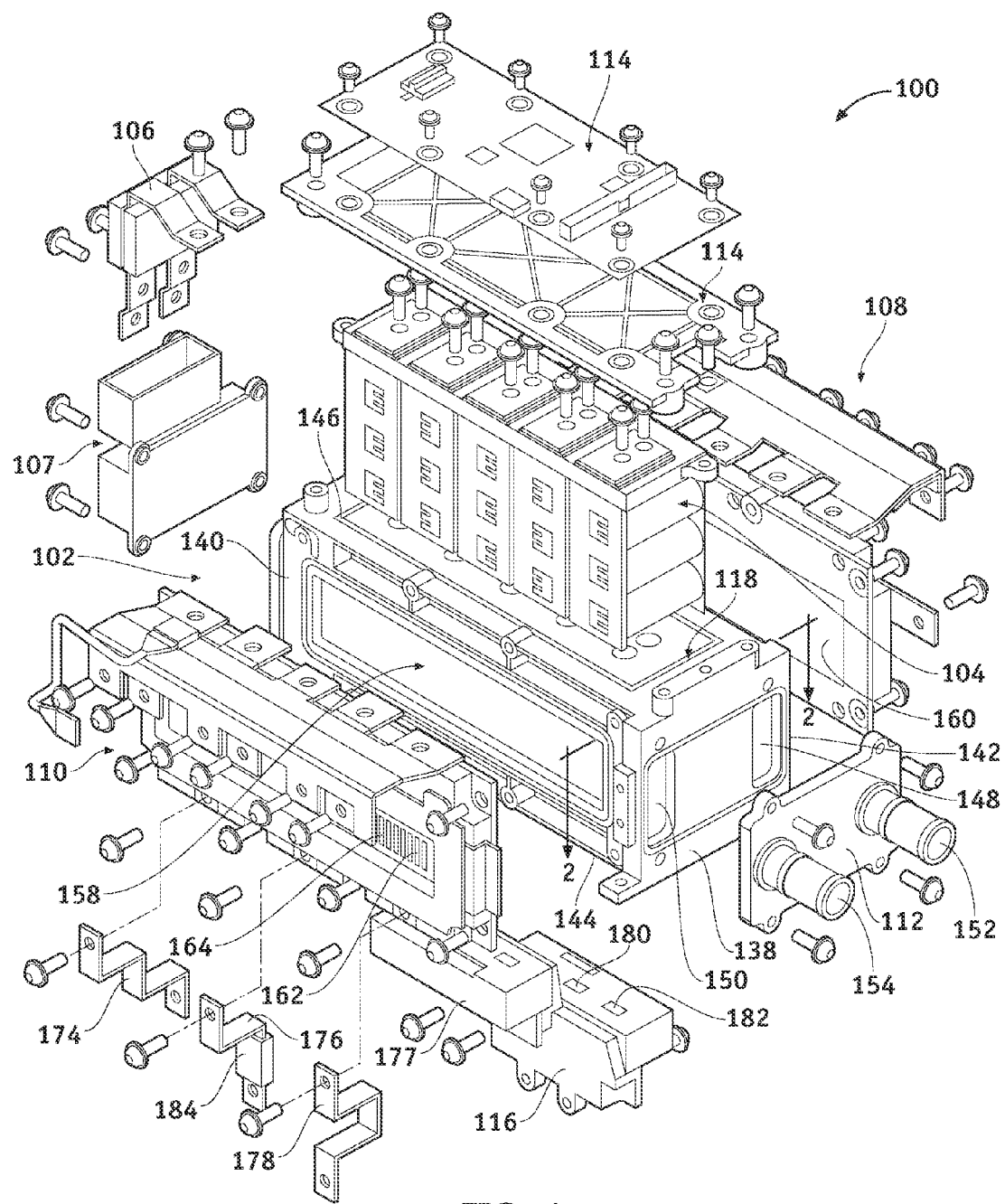
FIG. 1 is an exploded isometric view of a power inverter, according to an embodiment.

DESCRIPTION OF EXEMPLARY
EMBODIMENTS

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIG. 1 is an exploded isometric view of a power inverter 100, according to an embodiment. The power inverter 100 is adapted to convert direct current power into alternating current power and may be used in a vehicle, such as an automobile, or any other landcraft, aircraft, watercraft, spacecraft, and the like. In an embodiment in which the inverter 100 is employed in an automobile, the automobile may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). Although not shown, the automobile may also incorporate any one of, or combination of, a number of different types of engines that provides the direct current power to the inverter 100, such as, for example, a gasoline or diesel fueled combustion engine, a "flex fuel vehicle" (FFV) engine (i.e., an engine that uses a mixture of gasoline and alcohol), a gaseous compound (e.g., hydrogen and natural gas) fueled engine, a combustion/electric motor hybrid engine (i.e., a "hybrid vehicle"), and/or an electric motor.

According to an embodiment, the power inverter 100 is configured to receive a fluid, such as a coolant, from a fluid source (not shown) and to circulate the fluid through cavities formed in the power inverter 100. In this way, components that are included as part of the power inverter 100 may be cooled by the fluid. The power inverter 100 includes a frame 102 to which the various components are mounted. In an embodiment, the components include a capacitor assembly 104, an input filter 106, first and second power module assemblies 108, 110, a connector plate 112, a control assembly 114, and current sensor modules 116. In other embodiments, the power inverter 100 may include additional components or fewer components than listed previously.

According to an embodiment, the frame 102 is adapted to provide structure to the inverter 100. For example, the frame 102 may have a substantially three-dimensionally rectangular shape and may include two end walls 138, 140, two sidewalls 142, 144, and an interior box 146. The two sidewalls 142, 144 extend between the two end walls 138, 140 to define a cavity 118 within which the interior box 146 may be disposed. According to an embodiment, the sidewalls 142, 144 define a length of the frame 102, wherein the length is in a range of from about 8 cm to about 45 cm, and the end walls 138, 140 define a width of the frame 102, wherein the width is in a range of from about 3 cm to about 20 cm. The walls 142, 144, 138, 140 may also provide a height of the frame 102, wherein the height is in a range of from about 6 cm to about 20 cm. In other embodiments, the dimensions of the walls 142, 144, 138, 140 may be greater or less, depending on a limitation of space that may be imposed on the power inverter 100. Additionally, the frame 102 may not be rectangular in other embodiments, and may be, for example, spherical, cylindrical or another three-dimensional shape.

The cavity 118 formed by the walls 142, 144, 138, 140 of the frame 102 may have dimensions that depend on the thicknesses of the walls 142, 144, 138, 140. For example, the cavity 118 may have a length in a range of from about 7 cm to about 44 cm, a width in a range of from about 2 cm to about 19 cm, and a height in a range of from about 5 cm to about 19 cm. In other embodiments, the dimensions of the cavity 118 may be greater or less. In still other embodiments, the dimensions may extend a majority of the length and width, as well as substantially the entire height of the frame 102.

The capacitor assembly 104 and the input filter 106 are adapted to be at least partially disposed in the frame 102. According to an embodiment, the capacitor assembly 104 is substantially rectangular in shape with dimensions similar to those of the interior box 146 of the frame 102. Although not illustrated, the capacitor assembly 104 includes a set of conductor plates, or sets of conductive plates, spaced apart from each other and wound into coils to form a capacitor, or multiple capacitors, as is commonly understood. The input filter 106 is connected to an end of the capacitor assembly 104, and in one embodiment, includes a Faraday coil that is electrically coupled to the capacitor(s) within the capacitor assembly 104. In accordance with an embodiment, the input filter 106 may be an electromagnetic interference (EMI) filter, or any other type of suitable filter for use in conjunction with a capacity assembly 104. In accordance with an embodiment, the input filter 106 may be disposed in a housing assembly 107, which may be received in the cavity 118. Although not shown, an epoxy or resin material may be placed in the cavity 118 with the capacitor assembly 104 and the input filter 106 (or housing assembly 107) to encase the assembly 104 and filter 106 in the interior box 146, as well as secure the assembly 104 and the filter 106 to the frame 102.

As noted above, the power module assemblies 108, 110 are coupled to the sidewalls 142, 144 of the frame 102 over the openings (only one of which is shown, opening 158), respectively. Each power module assembly 108, 110 include a power module substrate 160, 162 and a power module device 164 (only one device 164 corresponding to substrate 162 is shown) attached to the substrate 160, 162. In other embodiments, more power module devices may be included. For example, in other embodiments, three power module devices may be included. In other embodiments, more or fewer may be employed. In an embodiment, the power module substrates 160, 162 are aligned with the openings 158 and secured to the corresponding sidewalls 142, 144 of the frame 102 to thereby cover the openings 158. The power module substrate 160 may be attached to the walls 142, 144 via any one of numerous manners suitable for forming leak-tight seals therewith. For example, a gasket or o-ring seal may be used. The connector plate 112 is secured to the end wall 142 of the frame 102 opposite the input filter 106 such that the inlet port 152 and the outlet port 154 are in fluid communication with the inlet opening 148 and the outlet opening 150, respectively, as shown in FIG. 1.

The control assembly 114 is adapted to measure and detect currents (via the current sensor modules 116) that may flow across the power module device 164 and to provide command signals to the power module device 164, when the measurements are greater than or less than a desired value. In an embodiment, the control assembly 114 is mounted to the frame 102 over the capacitor assembly 104 and includes a microprocessor, as is commonly understood, for controlling the operation of the inverter 100 as described below.

The current sensor module 116 includes a housing 170 and sensors (not shown) disposed in the housing 170. In accordance with an embodiment, the current sensor modules 116 are sense current flowing through busbars 174, 176, 178, when the current flows from the powder module assemblies 108, 110 to an A/C output (not shown) of the inverter 100. The busbars 174, 176, 178 extend through openings 180, 182 (only two of which are shown) formed in the housing 170 and may be bolted or otherwise fastened to an A/C output 177 of the power module device 164 and to an A/C output (not shown) of the inverter 100.

To maintain the current sensor module 116 on the busbars 174, 176, 178, one or more sensor mount assemblies 184 (one of which is shown here) are included on the busbars 174, 176, 178. FIG. 2 is a perspective view of a busbar 200 including a sensor mount assembly 202, according to an embodiment, FIG. 3 is a perspective view of the busbar 200 of FIG. 2, according to another embodiment, and FIG. 4 is a perspective view of the busbar 200 of FIG. 2 inserted through a portion of a housing 400 within which a sensor (not shown) is disposed, according to an embodiment. Referring simultaneously to FIGS. 2-4, the busbar 200 extends through an opening 402 in the housing 400 and has a first end 204, a second end 206, a first side 208, and a second side 210, according to an embodiment. The first and second sides 208, 210 may include axial edges 212, 214 also extending from the first end 204 to the second end 206 of the busbar 200. In accordance with an embodiment, the busbar 200 may have dimensions such as an axial length measured from the first end 204 to the second end 206 in a range of from about 4 cm to about 50 cm, a width measured between the axial edges 212, 214 in a range of from about 0.5 cm to about 4 cm, and a thickness measured between the first and the second sides 208, 210 in a range of from about 1 mm to about 6 mm. In other embodiments, the dimensions of the busbar 200 may be greater or less than the aforementioned ranges. Although the busbar 200 is shown as be substantially rectangular in shape, other embodiments may employ irregularly-shaped bars, curved bars, or bars having a different shape. According to an embodiment, the busbar 200 may include fastener openings 216, 218 formed proximate each end 204, 206. The fastener openings 216, 218 may be used to mount the busbar 200, and hence the mount assembly 202 and the housing 400, to a chassis (not shown).

The mount assembly 202 may comprise a unitary component and may be overmolded onto the busbar 200, in an embodiment. In one embodiment, the mount assembly 202 may include a main body 220, a backing feature 225, and fingers 224, 226. In accordance with an embodiment, the mount assembly 202 may comprise a compliant material in order to allow the first and the second fingers 224, 226 to deform during assembly. In an embodiment, the compliant material may be a material capable of temporarily deforming to the contracted state upon application of a force and of returning to an original configuration when the force is removed. Suitable materials include, but are not limited to glass-reinforced nylon or polyphenylene sulfide plastic. The main body 220 and the backing feature 225 are overmolded onto the busbar 200, in accordance with an embodiment. According to another embodiment, in addition to being overmolded onto the busbar 200, the main body 220 and/or backing feature 225 are mechanically affixed to the busbar 200 either with an adhesive or by a fastener (not shown). For example, the main body 220 and/or backing feature 225 may be adhered to the busbar 200 using an epoxy or another similar adhesive material.

In any case, the main body 220 is disposed between the first and second ends 204, 206 of the busbar 200. The main body 220 may have an axial length measured from an end of the backing feature 225 that is in a range of from about 0.5 cm to about 10 cm. In other examples, the axial length of the main body 220 may be longer or shorter than the aforementioned range.

In accordance with an embodiment, the main body 220 may be disposed over the first and second sides 208, 210 and the axial edges 212, 214 of the busbar 200. In another embodiment, the main body 220 may be disposed on the first side 208 and/or the axial edges 212, 214 or on the second side 210 and/or the axial edges 212, 214. The main body 220 may have a thickness measured from a first major surface 258 of the main body 220 to a second major surface 260 of the main body 220 that is in a range of from about 0.2 cm to about 3 cm, according to an embodiment. In other embodiments, the thickness may be greater or less than the aforementioned range. In another embodiment, the main body 220 may have a width measured from a first axial edge 229 to a second axial edge 231 that is in a range of from about 0.6 cm to about 4 cm. In still other embodiments, the width of the main body 220 may be wider or narrower than the aforementioned range.

The backing feature 225 is configured to abut a first engagement surface 404 of the housing 400. According to an embodiment, the backing feature 225 includes a backing surface 222 and an attachment section 227. The backing surface 222 extends radially outwardly relative to the main body 220. The backing surface 222 may be ring-shaped and thus, may extend circumferentially around an entirety of the main body 220. In another embodiment, the backing surface 222 may be included on more than one projection extending radially relative to the main body 220. For example, the backing surface 222 may be included on one or more projections extending radially relative to the first axial edge 229 and/or the second axial edge 231 of the main body 220. In another example, the backing surface 222 may be included on one or more projections extending radially relative to the first and/or second major surfaces 258, 260 of the main body 220.

According to an embodiment, the backing surface 222 is formed so that a portion of the backing surface 222 has an intersection angle with the first and/or second axial edge 229, 231 of the main body 220 that is substantially equal to (e.g., within ±5°) 90°. In another embodiment, the backing surface 222 is formed so that a portion of the backing surface 222 has an intersection angle with the first and/or second major surfaces 258, 260 of the main body 220 that is substantially equal to (e.g., within ±5°) 90°. Alternatively, the intersection angle between the backing surface 222 and the axial edges 229, 231 or major surfaces 258, 260 of the main body 220 may be more or less than 90°; however, it will be appreciated that no matter the particular angle, the intersection angle is sufficient to allow the first engagement surface 404 on the housing 400 to contact the backing surface 222 and to prevent the housing 400 from being moved axially in one direction. In still another embodiment, the surface may be substantially flat, curved or have any other contour.

The attachment section 227 extends axially from the backing surface 222 and may be included to further secure the mount assembly 202 to the busbar 200. In an embodiment, the attachment section 227 may be configured to be more structurally robust than the main body 220 and thus, may be longer, thicker, and/or wider than the main body 220. According to an embodiment, the attachment section 227 has an axial length that is in a range of from about 0.5 cm to about 10 cm, a thickness measured between a first major surface 228 of the attachment section 227 to a second major surface 230 of the attachment section 227 in a range of from about 0.6 cm to about 4 cm, and a width measured between a first axial edge 221 to a second axial edge 223 in a range of from about 0.5 cm to about 5 cm. In other embodiments, the dimensions of the attachment section 227 may fall outside of one or more of the aforementioned ranges.

The first finger 224 is configured to maintain the housing 400 at a particular axial position on the main body 220. In an embodiment, the first finger 224 has a first end 232, a second end 234, and a tooth 236 and is connected to the main body 220 via the backing surface 222. In particular, the first end 232 may be disposed on the backing surface 222, in an embodiment. According to an embodiment, the first finger 224 extends along the first axial edge 229 of the main body 220. In another embodiment, the first finger 224 extends along the first major surface 258 of the main body 220. In yet another embodiment, the first finger 224 extends along both the first axial edge 229 and the first major surface 258 of the main body 220. In still yet another embodiment, the first finger 224 additionally extends along the second axial edge 231 of the main body 220. In accordance with an embodiment, the first finger 224 has an axial length that is less than the axial length of the main body 220. For example, the axial length of the first finger 224 may be in a range of from about 0.5 cm to about 4 cm. In other embodiments, the first finger 224 may have a longer or shorter axial length than the aforementioned range.

The tooth 236 is formed on the second end 234 of the first finger 224 and projects radially outwardly from the first finger 224. In accordance with an embodiment, the tooth 236 includes a retention surface 238 against which a second engagement surface 406 of the housing 400 abuts. According to an embodiment, the retention surface 238 and at least a portion of the backing surface 222 may be axially aligned to maintain the housing 400 therebetween. In such case, a distance between the retention surface 238 and the backing surface 222 may be substantially equal to (e.g., within ±0.05 cm) a width of the housing 400. In another embodiment, the retention surface 238 and the backing surface 222 are not axially aligned with each other, but are positioned to maintain the housing 400 therebetween.

In accordance with an embodiment, the tooth 236 may include an axial surface 239 that originates from the second end 258 of the first finger 224 (or from an axial location proximate to the second end 258) and terminates at an axial location on the first finger 224. Although the axial surface 239 is shown as being tapered and forming a sharp edge with the retention surface 238 in FIGS. 2-4, the axial surface 239 may not be tapered and/or the edge may be rounded, in other embodiments.

In another embodiment, the second finger 226 is included to operate with the first finger 224 to ensure that the housing 400 is maintained in position on the main body 220. In this regard, the second finger 226 may be disposed on the main body 220 at a location opposite from the first finger 224. For example, in an embodiment in which the first finger 226 extends from the first axial edge 229 of the main body 220, the second finger 258 may extend from the second axial edge 231 of the main body 220. In an alternate example in which the first finger 226 extends from the first major surface 258 of the main body 220, the second finger 258 may extend from the second major surface 260 of the main body 220.

In any case, the second finger 226 has a first end 240, a second end 242, and a tooth 244 and is connected to the main body 220 via the backing surface 222. In an embodiment, the first end 240 is disposed on the backing surface 222. According to an embodiment, the second finger 226 extends along the second axial edge 231 or the second major surface 260 of the main body 220, depending on the configuration of the first finger 224. In accordance with an embodiment, the second finger 226 has an axial length that is less than the axial length of the main body 220. For example, the axial length of the second finger 226 may be in a range of from about 0.5 cm to about 4 cm. In other embodiments, the second finger 226 may have a longer or shorter axial length than the aforementioned range. In still other embodiments, the axial length of the second finger 226 may be substantially equal to (e.g., within about 0.05 cm of) the axial length of the first finger 224. In yet other embodiments, the axial lengths may not be equal.

The tooth 244 is formed on the second end 242 of the second finger 226 and projects radially outwardly from the second finger 226. In accordance with an embodiment, the tooth 244 includes a retention surface 246 against which the second engagement surface 406 of the housing 400 abuts. According to an embodiment, the retention surface 246 and at least a portion of the backing surface 222 may be axially aligned to maintain the housing 400 therebetween. In such case, a distance between the retention surface 246 and the backing surface 222 may be substantially equal to (e.g., within ±0.05 cm) a width of the housing 400. In another embodiment, the retention surface 246 and the backing surface 222 are not axially aligned with each other, but are positioned to maintain the housing 400 therebetween.

In accordance with an embodiment, the tooth 244 may include an axial surface 248 that originates from the second end 242 of the second finger 226 (or from an axial location proximate to the second end 242) and terminates at an axial location on the second finger 226. Although the axial surface 248 is shown as being tapered and forming a sharp edge with the retention surface 246 in FIGS. 2 and 3, the axial surface 248 may not be tapered and/or the edge may be rounded, in other embodiments.

The first finger 224 and/or the second finger 226 are configured such that they may be mechanically deformed from an original, expanded state to a temporary, contracted state, upon a supply of force. In this regard, in the expanded state, each finger 224, 226 is spaced a predetermined distance apart from the main body 220. The predetermined distance may be substantially uniform along an axial length of the fingers 224, 226, in an embodiment. In other embodiments, the predetermined distance may vary along the axial length. Preferably, the predetermined distance for the spacing of each finger 224, 226 is such that a width measured from the tooth 236 of the first finger 224 to the tooth 244 of the second finger 226 is greater than a corresponding width of the housing opening 402, when the mount assembly 202 is disposed in the opening 402. In other embodiments in which only a first finger 224 is included, the spacing between the first finger 224 and the main body 220 is such that a width measured from the tooth 236 of the first finger 224 to the second axial edge 231 or the second major surface 260, depending on the location of the first finger 224 relative to the main body 220, is greater than a corresponding width of the housing opening 402, when the mount assembly 202 is disposed in the opening 402. In an embodiment, one or both of the fingers 224, 226 are further configured such that in the contracted state, the fingers 224, 226 are forced radially inwardly toward the main body 220 and a resultant distance between the fingers 224, 226 and the main body 220 is less than the width of the housing opening 402, when the mount assembly 202 is disposed in the opening 402.

During assembly, the first end 204 of the busbar 200 is inserted through the opening 402 of the housing 400. The first ends 232, 240 of the fingers 224, 226 are also inserted through the opening 402. Because the dimensions of the opening 402 may be smaller than the dimensions of the sensor mount assembly 202 in an expanded state, the fingers 224, 226 may mechanically deform when forced through the housing opening 402. The fingers 224, 226 are contracted radially inwardly toward the main body 220, and the sensor mount assembly 202 is pushed through the housing opening 402 until the backing surface 222 abuts the first engagement surface 404 of the housing 400. The fingers 224, 226 then snap back into the expanded configuration and expand radially outward so that the retention surfaces 238, 246 of the fingers 224, 226 abut the second engagement surface 406 of the housing 400. In this way, the housing 400 is maintained in position on the main body 220.

Sensor mount assemblies and sensor assemblies have now been provided that may be simpler and less expensive to manufacture than conventional sensor modules. The sensor mount assemblies and sensor assemblies may be retrofitted into existing power inverters and/or may be implemented into new power inverters. Additionally, although the sensor mount assemblies and sensor assemblies are shown and described as being disposed in a power inverter, the sensor mount assemblies and sensor assemblies may be used in other components that may benefit from a simpler manner by which to couple one device to another.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A sensor mount assembly comprising:
   a busbar having a first end and a second end;
   a main body overmolded onto the busbar;
   a backing surface extending radially outwardly relative to the main body; and
   a first finger extending axially from the backing surface, the first finger having a first end, a second end, and a tooth, the first end of the first finger disposed on the backing surface, and the tooth formed on the second end of the first finger.

2. The sensor mount assembly of claim 1, wherein the first finger is spaced apart from the main body.

3. The sensor mount assembly of claim 1, further comprising:
   a second finger extending axially from the backing surface, the second finger having a first end, a second end, and a tooth, the first end of the second finger disposed on the backing surface, and the tooth of the second finger formed on the second end of the second finger.

4. The sensor mount assembly of claim 3, wherein:
   the main body has a first axial edge and a second axial edge;
   the first finger extends along the first axial edge of the main body; and
   the second finger extends along the second axial edge of the main body.

5. The sensor mount assembly of claim 1, wherein:
   the tooth includes a portion that projects radially outwardly from the first finger.

6. The sensor mount assembly of claim 1, wherein:
   the backing surface extends circumferentially around an entirety of the main body.

7. The sensor mount assembly of claim 1, wherein:
   the main body and the first finger are formed as a unitary component.

8. The sensor mount assembly of claim 1, wherein:
   the main body and the first finger comprise a material selected from the group consisting of glass-reinforced nylon and polyphenylene sulfide plastic.

9. A sensor assembly comprising:
   a housing having a first engagement surface, a second engagement surface, and an opening;
   a sensor disposed in the housing;
   a busbar extending through the opening of the housing and having a first end and a second end;
   a main body overmolded onto the busbar and disposed in the opening of the housing;
   a backing surface extending radially outwardly relative to the main body and abutting the first engagement surface of the housing; and
   a first finger extending axially from the backing surface, the first finger having a first end, a second end, and a tooth, the first end of the first finger disposed on the backing surface, and the tooth formed on the second end of the first finger and having a retention surface abutting the second engagement surface of the housing.

10. The sensor assembly of claim 9, further comprising:
    a second finger extending axially from the backing surface, the second finger having a first end, a second end, and a tooth, the first end of the second finger disposed on the backing surface, and the tooth of the second finger formed on the second end of the second finger and having a retention surface abutting the second engagement surface of the housing.

11. The sensor assembly of claim 10, wherein:
    the first finger is spaced apart from the main body;
    the second finger is spaced apart from the main body; and
    a length from the tooth of the first finger to the tooth of the second finger is greater than a corresponding width of the opening of the housing.

12. The sensor assembly of claim 10, wherein:
    the main body has a first axial edge and a second axial edge;
    the first finger extends along the first axial edge of the main body; and
    the second finger extends along the second axial edge of the main body.

13. The sensor assembly of claim 9, wherein:
    the tooth includes a portion that projects radially outwardly from the first finger.

14. The sensor assembly of claim 9, wherein:
    the backing surface extends circumferentially around an entirety of the main body.

15. The sensor assembly of claim 9, wherein:
    the main body and the first finger are formed as a unitary component.

16. The sensor assembly of claim 9, wherein:
    the main body and the first finger comprise a material selected from the group consisting of glass-reinforced nylon and polyphenylene sulfide plastic.

17. A sensor assembly comprising:
    a housing having a first engagement surface, a second engagement surface, and an opening;
    a sensor disposed in the housing;
    a busbar extending through the opening of the housing and having a first end and a second end; and a mount assembly including:
- a main body overmolded onto the busbar and disposed in the opening of the housing,
- a backing surface extending radially outwardly relative to the main body and abutting the first engagement surface of the housing,
- a first finger extending axially from the backing surface, the first finger having a first end, a second end, and a tooth, the first end of the first finger disposed on the backing surface, and the tooth of the first finger formed on the second end of the first finger and having a retention surface abutting the second engagement surface of the housing, and
- a second finger extending axially from the backing surface, the second finger having a first end, a second end, and a tooth, the first end of the second finger disposed on the backing surface, and the tooth of the second finger formed on the second end of the second finger and having a retention surface abutting the second engagement surface of the housing.

18. The sensor assembly of claim 17, wherein:
the first finger is spaced apart from the main body;
the second finger is spaced apart from the main body; and
a length from the tooth of the first finger to the tooth of the second finger is greater than a corresponding width of the opening of the housing.

19. The sensor assembly of claim 17, wherein:
the backing surface extends circumferentially around an entirety of the main body.

20. The sensor assembly of claim 17, wherein:
the main body and the first finger comprise a material selected from the group consisting of glass-reinforced nylon and polyphenylene sulfide plastic.

* * * * *